United States Patent
Kojima (10) Patent No.: US 7,154,310 B2
(45) Date of Patent: Dec. 26, 2006

(54) TRAPEZOID SIGNAL GENERATING CIRCUIT

(75) Inventor: Akio Kojima, Nukata-gun (JP)

(73) Assignee: Denso Corporation, Kariya (JP)

( * ) Notice: Subject to any disclaimer, the term of this patent is extended or adjusted under 35 U.S.C. 154(b) by 211 days.

(21) Appl. No.: 10/808,542

(22) Filed: Oct. 7, 2004

(65) Prior Publication Data
US 2006/0152258 A1    Jul. 13, 2006

(30) Foreign Application Priority Data
Mar. 28, 2003    (JP)    ............................. 2003-090967

(51) Int. Cl.
*H03K 4/94*    (2006.01)
(52) U.S. Cl. ..................................... 327/130
(58) Field of Classification Search ........ 327/130–132, 327/113, 126–127
See application file for complete search history.

(56) References Cited

U.S. PATENT DOCUMENTS 4,320,521 A * 3/1982 Balakrishnan et al. ...... 375/257
5,025,172 A * 6/1991 Carroll et al. .............. 327/130
7,005,901 B1 * 2/2006 Jiang et al. ................. 327/130

FOREIGN PATENT DOCUMENTS

JP    A-S52-112263    9/1977

* cited by examiner

*Primary Examiner*—Dinh T. Le
(74) *Attorney, Agent, or Firm*—Posz Law Group, PLC (57) ABSTRACT

A trapezoid signal generating circuit has a charging and discharging circuit for a capacitor to generate a trapezoid signal which has less change at its rising portion and falling portion. Current output circuits supply a charging current and a discharging current in accordance with a voltage outputted from a current control circuit, respectively. The current control circuit has a charging and discharging circuit similar to the charging and discharging circuit, and produces an output voltage. This voltage increases in accordance with a linear function for a period from a time point when an input signal changes its level to a time point when the voltage reaches a reference voltage, and decreases thereafter in accordance with a linear function. The current flowing into the capacitor also increases and decreases in accordance with the linear function, so that the terminal voltage of the capacitor increases and decreases in accordance with a quadratic function.

10 Claims, 6 Drawing Sheets

TRAPEZOID SIGNAL GENERATING CIRCUIT

CROSS REFERENCE TO RELATED APPLICATION

This application is based on and incorporates herein by reference Japanese Patent Application No. 2003-90967 filed on Mar. 28, 2003.

FIELD OF THE INVENTION

The present invention relates to a trapezoid signal generating circuit, which generates a trapezoid signal by controlling a charging and discharging current of a capacitor.

BACKGROUND OF THE INVENTION

When a level of a rectangular signal changes, noises will arise due to harmonic components included in the sharp rising portions and the sharp falling portions of the rectangular signal. For instance, if the rectangular signal having the frequently changing levels is used in vehicle-mounted electronic devices, radio noises are generated. It is effective to use a trapezoid signal in place of the rectangular signal for reducing such noises.

JP-A-52-112263 discloses a waveform shaping circuit, which changes the inclination of one of the rising slope and the falling slope of a trapezoid signal in the middle of the slope. This circuit increases the inclination of the sharper one of the inclination-changed slopes to be sharper than the inclination of the other slope, which is not inclination-changed. This circuit decreases the inclination of the less sharp one of the inclination-changed slopes to be less sharp than the inclination of the other slope, which is not inclination-changed. Specifically, this circuit has a capacitor, and changes a charging and discharging current of the capacitor in steps according to the terminal voltage of the capacitor.

Figure 6:
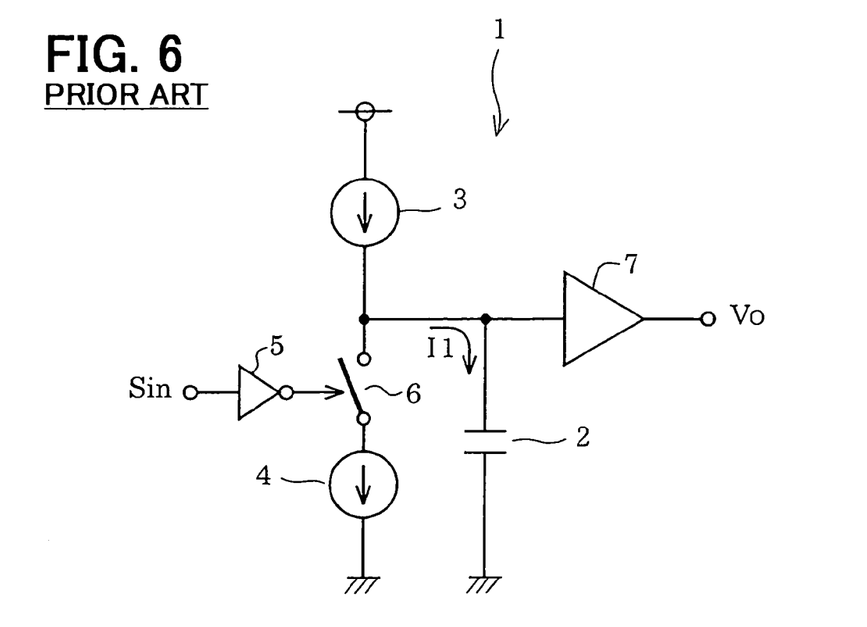
FIG. 6 is an electric circuit diagram showing a trapezoid signal generating circuit according to a prior art.
Figure 7:
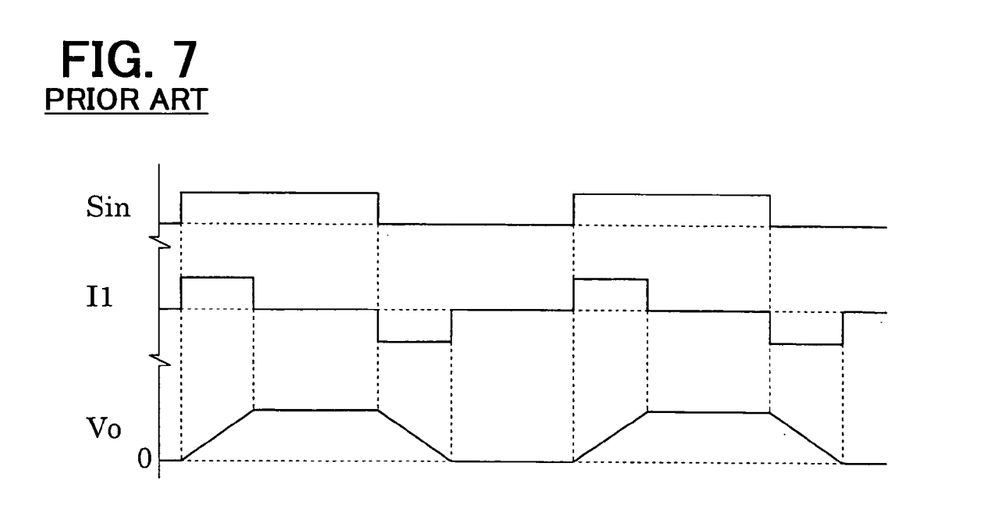
FIG. 7 is a waveform diagram showing signal waveforms appearing at various points in the prior art.

FIG. 6 shows an example of a trapezoid signal generating circuit, and FIG. 7 shows the waveforms of operation signals of the trapezoid signal generating circuit 1. When an input signal Sin becomes a high level H, a switch 6 turns off via an inverter 5. A capacitor 2 is charged with an output current I1 of a constant current circuit 3. Thus, the output voltage Vo outputted via a buffer 7 linearly increases to a fixed level. When the input signal Sin becomes a low level L, the switch 6 turns on. The capacitor 2 is discharged with a current I1 which corresponds to the difference between the output currents of the constant current circuits 3 and 4. Thus, the output voltage Vo linearly decreases to zero.

In the voltage Vo (trapezoid signal) thus generated, the inclination changes in a stepwise manner at the shoulder portions of its rising portion and falling portion (increase/decrease starting portion or increase/decrease ending portion). As a result, it is difficult to sufficiently reduce the harmonic components. Therefore, the above prior art proposes to reduce changes of the inclination at the shoulder portions by changing the charging and discharging current in steps. In case of changing the charging and discharging current in steps in accordance with the terminal voltage of the capacitor 2, however, comparators in the number corresponding to the number of change steps are necessitated. The circuit size will be complicated more as the waveform is smoothed more.

SUMMARY OF THE INVENTION

Accordingly, it is an objective of the present invention to provide a trapezoid signal generating circuit, which generates a gradually changing trapezoid signal while minimizing a circuit size.

According to the present invention, a first and a second current output circuits for controlling a charging and a discharging of a capacitor are provided. A discharging current of the second current output circuit is set larger than a charging current of the first current output circuit. When a waveform control signal is at a first level, the capacitor is discharged with a difference current between the charging current and the discharging current. The rate of falling of a terminal voltage of the capacitor, that is, a trapezoid signal, is determined in accordance with the difference current. When the waveform control signal is at a second level, the discharging current is stopped. Thus, the capacitor is charged with the charging current of the first current output circuit. The rate of rising of the trapezoid signal at this time is determined in accordance with the charging current.

The first and the second current output circuits are constructed to supply the charging current and the discharging current in accordance with command signals, respectively. A current control circuit is constructed to be able to continuously output the command signal like, for instance, a charging and discharging circuit described below. Thus, the charging current continuously increases after the time point when the waveform control signal changes from the first level to the second level, and continuously decreases after the time point when the trapezoid signal reaches a fixed reference level. In addition, both the charging current and the discharging current continuously increase after the time point when the waveform control signal changes from the second level to the first level, and continuously decreases after the time point when the trapezoid signal reaches the reference level.

The trapezoid signal results from an integration of the charging and discharging current. As a result, the inclination of the slope of the trapezoid signal at the shoulder portion (increase/decrease starting portion or increase/decrease ending portion) is changed very gradually by the above control, so that the harmonic components included in the trapezoid signal may be reduced. That is, a continuous current control is attained based on the command signal generated by the current control circuit, in stead of a stepwise current control based on a terminal voltage of a capacitor. As a result, a plurality of comparators need not be used, and noise generation can be reduced while minimizing the circuit size as much as possible. Because the time point to change the charging and discharging current from an increase to a decrease is controlled based on a comparison of the trapezoid signal with the reference voltage, the terminal voltage of the capacitor after the rising and after the falling can be controlled.

DETAILED DESCRIPTION OF THE INVENTION (First Embodiment)

Figure 1:
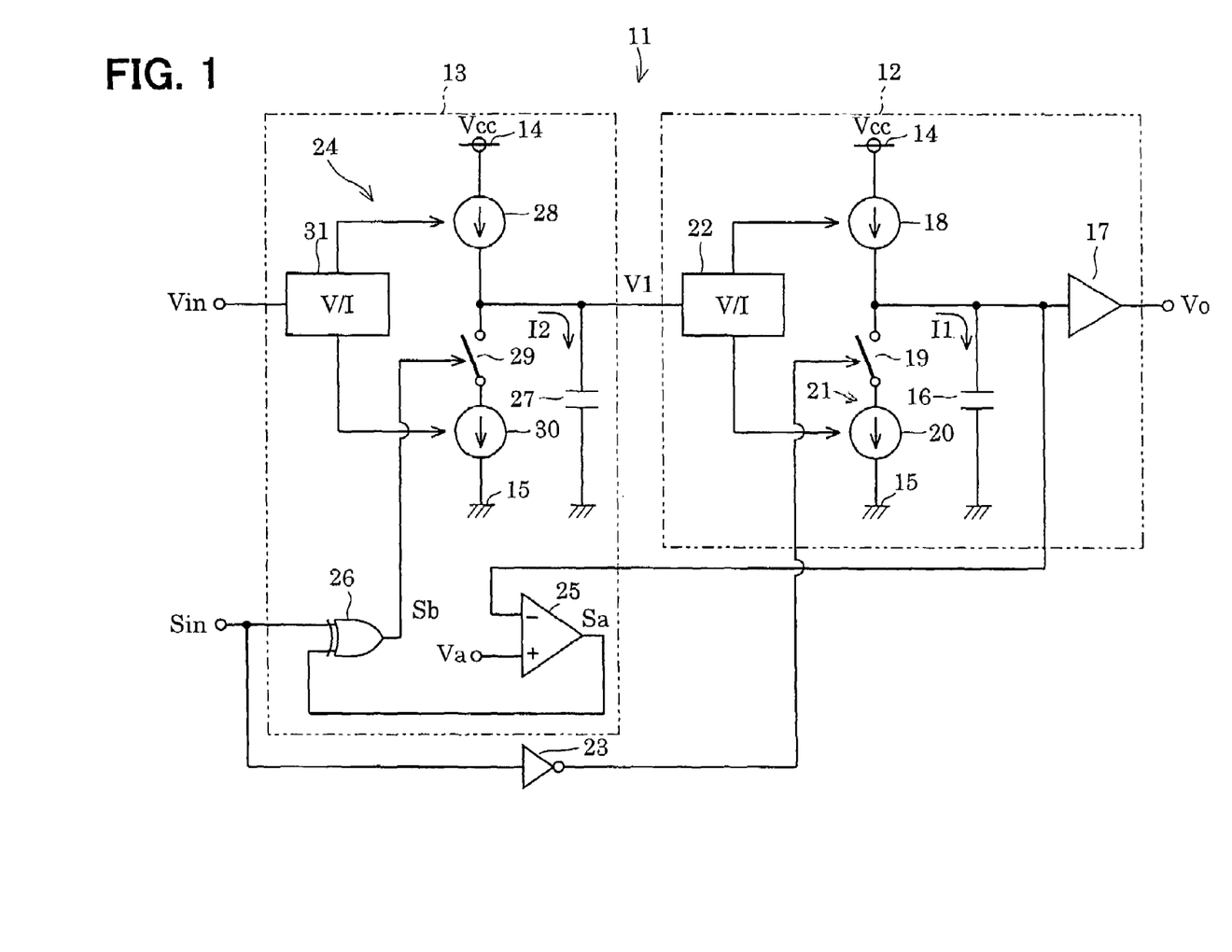
FIG. 1 is an electric circuit diagram showing a trapezoid signal generating circuit according to the first embodiment of the present invention.

A trapezoid signal generating circuit 11 shown in FIG. 1 is built in a control IC (semiconductor integrated circuit device) used in an ECU (electronic control unit) for controlling a chassis system of a vehicle such as doors, mirrors, seats, wipers, meters or an air-conditioner. This control IC also includes, in addition to this trapezoid signal generating circuit, digital circuits like a CPU or memories having various functions, and analog circuits having various functions.

The control IC has a function of receiving from a plurality of switches respective on/off conditions. Although not shown in the figure, one terminal of each switch is connected in common through a resistor, and the other terminal of each switch is grounded. A trapezoid signal generated by the trapezoid signal generating circuit 11 is applied periodically to the common terminal, so that the CPU responsively receives the voltage level of the one terminal of each switch through an input port. The trapezoid signal is applied periodically to the switches to reduce the current consumption and radio noises.

The trapezoid signal generating circuit 11 is constructed with a charging and discharging circuit 12 and a current control circuit 13, and operable with a power supply voltage Vcc between power supply lines 14 and 15. The trapezoid signal is generated as a voltage Vo between both terminals of a capacitor 16. This voltage Vo is outputted through a buffer 17.

A current output circuit (first current output circuit) 18 is connected to the power supply line 14 and one terminal of the capacitor 16. A series circuit (second current output circuit) 21, which comprises a switch 19 constructed with a transistor and a current output circuit 20, is connected between the one terminal of the capacitor 16 and the power supply line 15, that is, between the terminals of the capacitor 16. The current output circuits 18 and 20 are for respectively supplying the charging current and the discharging current of the capacitor 16. The current output circuit 20 allows the current of two times (K=2) of the current of the current output circuit 18.

The current output circuits 18 and 20 change the output currents in accordance with control signals applied thereto, respectively, while maintaining the relation of the current ratio of two. A V/I conversion circuit 22 receives a voltage (command signal) V1 outputted from the current control circuit 13, and applies control signals to the current output circuits 18 and 20 in correspondence with this voltage.

The switch 19 switches its on/off condition in response to an input signal (waveform control signal) Sin applied thereto through an inverter 23. Specifically, the switch 19 turns on in response to the L level (first level) of the input signal Sin, and turns off in response to the H level (second level) of the input signal Sin.

The current control circuit 13 is constructed with a charging and discharging circuit 24, a comparator 25 and an exclusive-OR gate 26. In the similar manner as the charging and discharging circuit 12, the charging and discharging circuit 24 is constructed with a capacitor (command signal capacitor) 27, a current output circuit 28 connected between the power supply line 14 and one terminal of the capacitor 27, a switch 20 and a current output circuit 30 connected in series between the terminals of the capacitor 27, and a V/I conversion circuit 31. A circuit portion of the charging and discharging circuit 24 other than the capacitor 27 operates as a charging and discharging current control circuit.

The comparator 25 is for comparing the voltage Vo with a reference voltage Va, which is one half of the power supply voltage Vcc. It produces a signal Sa, which becomes a L level and a H level when the voltage Vo becomes higher and lower than the reference voltage Va, respectively. The exclusive-OR gate 26 produces a signal Sb, which is an exclusive-OR logic of the input signal Sin and the signal Sa. The switch 29 turns off when the signal Sb becomes the L level, and turns on when the signal Sa becomes the H level.

Figure 2:
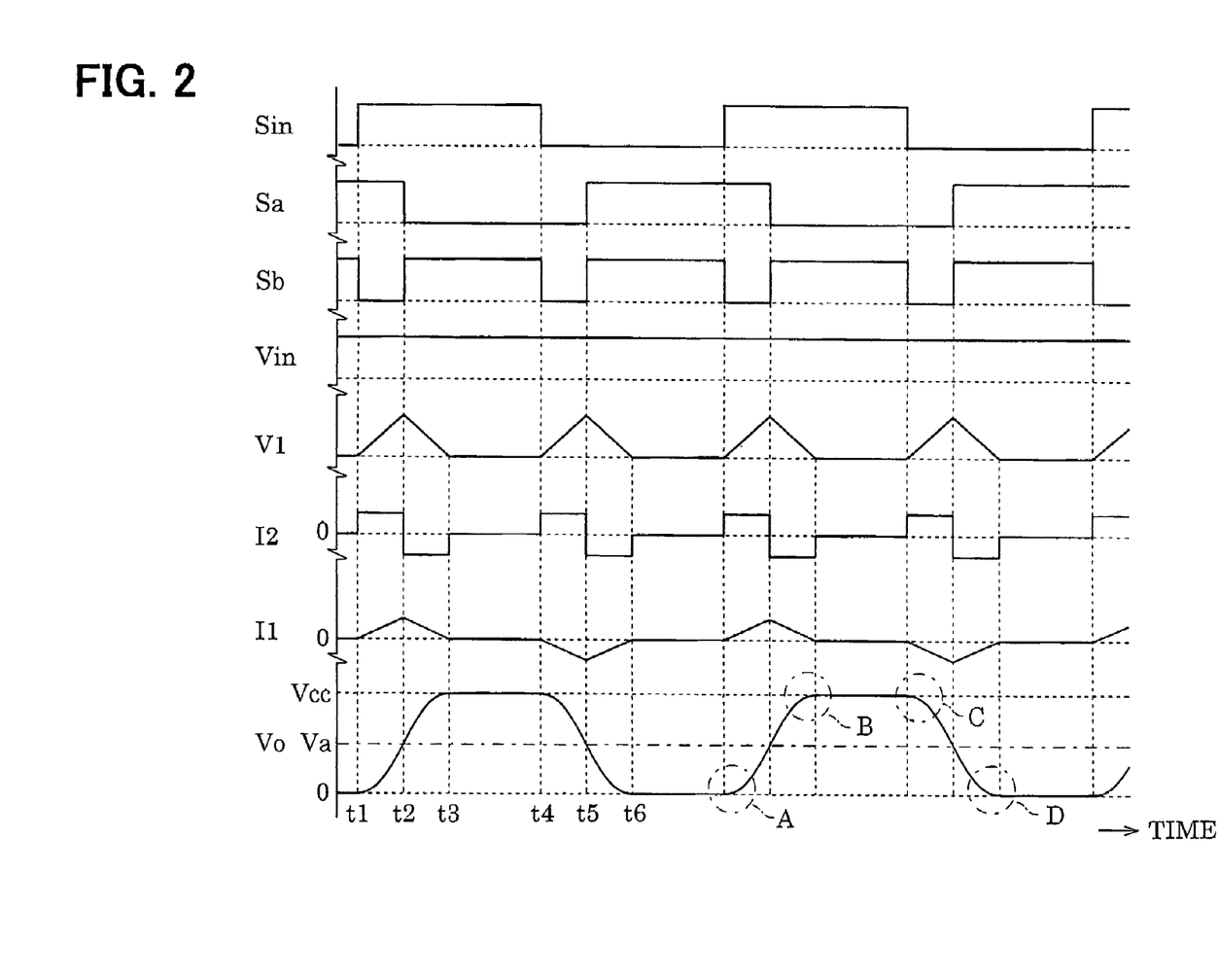
FIG. 2 is a waveform diagram showing signal waveforms appearing at various points in the first embodiment.

Next, the operation of the trapezoid signal generating circuit 11 is described with reference to the input signal Sin, output signal Sa of the comparator 25, output signal Sb of the gate 26, input voltage Vin, output voltage V1 of the current control circuit 13, current I2 flowing into the capacitor 27, current I1 flowing into the capacitor 16 and output voltage Vo of the trapezoid signal generating circuit 11 shown in FIG. 2. The input voltage Vin is a fixed level signal, and the input signal Sin is a periodic pulse signal having a fixed cycle period and a fixed H level time width. In FIG. 2, the waveforms are illustrated with shortened cycle period for convenience of illustration. The input signal Sin has in practice a cycle period of several tens of milliseconds and a H level time width of several hundreds of microseconds.

It is effective for reducing harmonic components at the rising portion and the falling portion of the voltage Vo, trapezoid signal, to gradually change the voltage changing rate (inclination) at the increase/decrease starting portions (A and C in FIG. 2) and at the increase/decrease ending portions (B and D in FIG. 2) of the voltage Vo. Therefore, the increase/decrease starting portion and the increase/decrease ending portion (shoulders) of the voltage Vo are changed continuously and smoothly in accordance with not a linear function (straight line) but with a quadratic function (curve line).

The terminal voltage Vo of the capacitor 16 results from an integration of the current I1 flowing into the capacitor 16. For this reason, the current I1 may be controlled as shown in FIG. 2, so that it increases in accordance with a linear function from the time point when the input signal Sin changes from the L level to the H level, and thereafter decreases in accordance with a linear function. For this purpose, as shown in FIG. 2, the voltage V1 as the command signal is required to rise in accordance with a linear function from the time point of the change of the input signal Sin and thereafter fall in accordance with a linear function, if the voltage-current input and output characteristic of the V/I conversion circuit 22 and the current output circuits 18 and 20 is linear.

More specifically, since the voltage Vo is decreased to about 0 volt and lower than the reference voltage Va at time t1 in FIG. 2, the output signal Sa of the comparator 25 is at the H level. When the input signal Sin changes from the L level to the H level, the switch 19 turns off and the output signal Sb of the gate 26 becomes the L level to turn off the switch 29. As a result, a positive fixed current I2 flows from the current output circuit 28 into the capacitor 27, and the terminal voltage V1 of the capacitor 27 linearly rises from 0 volt. Thus, a linearly increasing current I1 flows from the current output circuit 18 into the capacitor 16. Accordingly, the voltage Vo rises with a gradually increasing inclination in accordance with the quadratic function.

When the voltage Vo exceeds the reference voltage Va at time point t2, the signal Sa changes from the H level to the L level and the signal Sb changes from the L level to the H level. As a result, the switch 29 turns on and a negative fixed current I2 flows into the capacitor 27 so that the terminal voltage V1 of the capacitor 27 linearly falls. Thus, a linearly decreasing current I1 (>0) flows from the current output circuit 18 into the capacitor 16. Accordingly, the voltage Vo rises with a gradually decreasing inclination in accordance with the quadratic function. The voltage Vo stops rising when the voltage V1 becomes 0 at time point t3.

The output current ratio between the current output circuit 20 and the current output circuit 18 and the output current ratio between the current output circuit 30 and the current output circuit 28 are set to two. In addition, the reference voltage Va is set to one half of Vcc. For this reason, the voltage Vo becomes generally equal to the power supply voltage Vcc. Further, the waveforms of the voltage Vo between the time points t1 and t2 and between the time points t2 and t3 becomes symmetric. This operation is similar to the operation when the voltage Vo falls in the period from a time point t4 to a time point t6.

The control IC periodically outputs the voltage Vo in the trapezoid waveform by using this trapezoid signal generating circuit 11, and is enabled to detect the on/off condition of each switch sequentially or concurrently in the period (from time point t3 to time point t4) in which the voltage Vo is generally equal to the power supply voltage Vcc.

As described above, the current output circuits 18 and 20 of the charging and discharging circuit 12 are constructed to allow the charging current and the discharging current in accordance with the voltage V1 outputted from the current control circuit 13, respectively, in this embodiment. The current control circuit 13 is constructed to output the voltage V1, which increases and decreases in accordance with the linear function from the time point when the input signal Sin changes its level, by the charging and discharging circuit 24 of a single stage. As a result, the current I1 flowing into the capacitor 16 increases and decreases in accordance with the linear function, and the terminal voltage (trapezoid signal) Vo of the capacitor 16 rises and falls in accordance with the quadratic function. Thus, because the trapezoid signal changes its slopes gradually at it shoulders in waveform in particular, the harmonic components included in the trapezoid signal are reduced. Accordingly, the radio noises which will affect a radio receiver or other electronic devices mounted on a vehicle are reduced.

The trapezoid signal generating circuit 11 attains a continuous current control based on the voltage (command signal) V1 generated by the current control circuit 13. This is different from a stepwise current control, which may be attained based on the terminal voltage Vo of the capacitor 16. As a result, a smooth trapezoid signal can be generated without requiring a plurality of comparators. Thus, the circuit size is reduced and the cost of IC is reduced.

In addition, the current control circuit 13 compares the voltage Vo and the reference voltage Va by the use of a single comparator 25, and controls the magnitude of the voltage V1 from an increase to a decrease when the voltage Vo reaches the reference voltage Va. For this reason, the voltage Vo can be controlled accurately after the rising and falling of the trapezoid signal.

(Second Embodiment)

Figure 3:
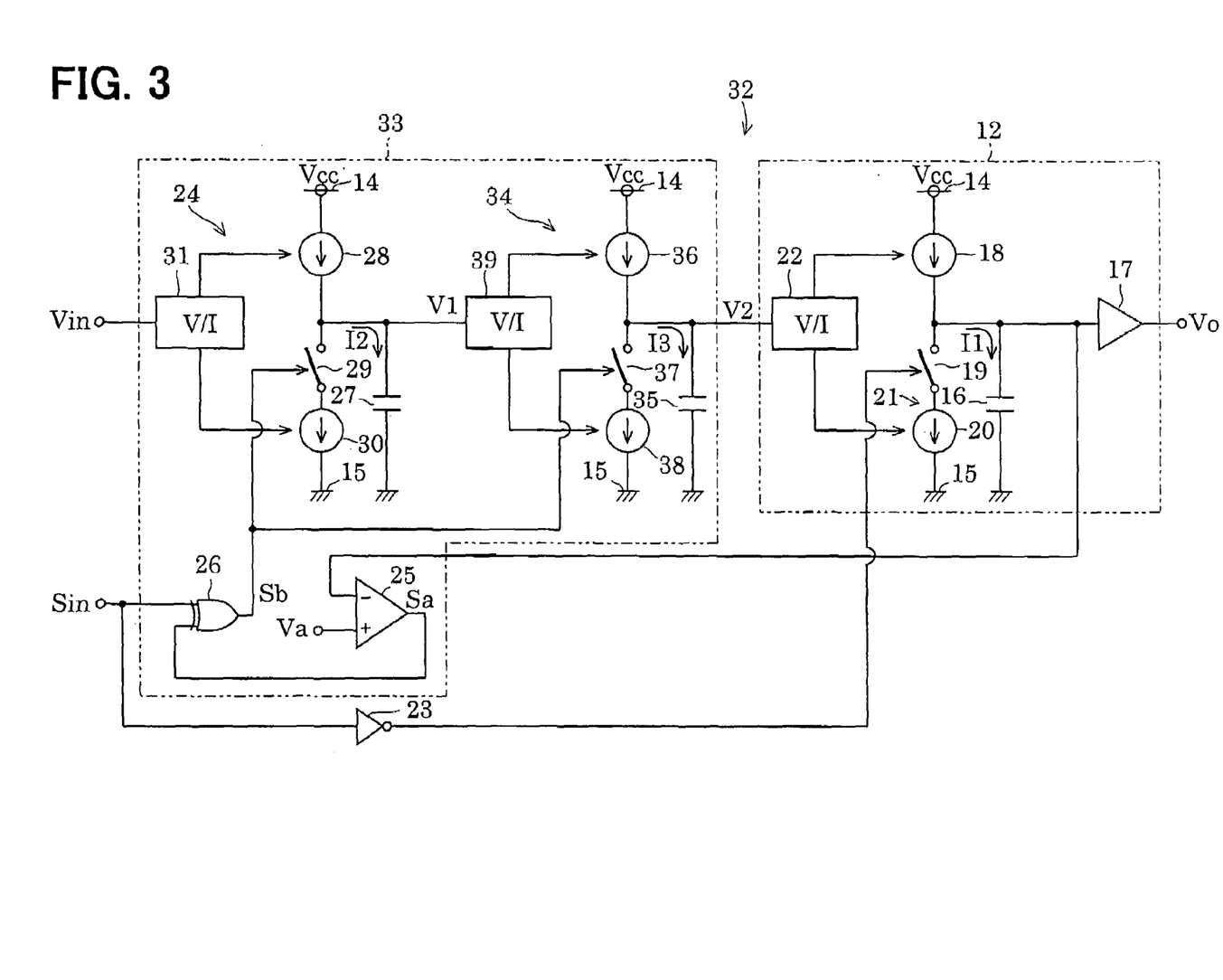
FIG. 3 is an electric circuit diagram showing a trapezoid signal generating circuit according to the second embodiment of the present invention.

FIG. 3 shows a trapezoid signal generating circuit, in which the same constructions as in FIG. 1 are represented with the same reference numerals. This trapezoid signal generating circuit 32 is different from the trapezoid signal generating circuit 11 shown in FIG. 1 in that a current control circuit 33 is constructed with cascade-connected two charging and discharging circuits 24 and 34.

The charging and discharging circuit 34 of the second stage is constructed with, in the similar manner as the charging and discharging circuit 24, a capacitor (command signal capacitor) 35, a current output circuit 36 connected between the power supply line 14 and one terminal of the capacitor 35, a switch 37 and a current output circuit 38 connected in series between the terminals of the capacitor 35, and a V/I conversion circuit 39. The switch 37 is constructed to be on/off-controlled by the signal Sb in the similar manner as the switch 29 is. The current output circuit 38 is constructed to output a two times current of the current output circuit 36. The charging and discharging circuit 34 other than the capacitor 35 corresponds to a charging and discharging circuit. This charging and discharging circuit 34 is constructed to receive the voltage V1 from the charging and discharging circuit 24 and output a voltage (command signal) V2 to the charging and discharging circuit 12.

Figure 4:
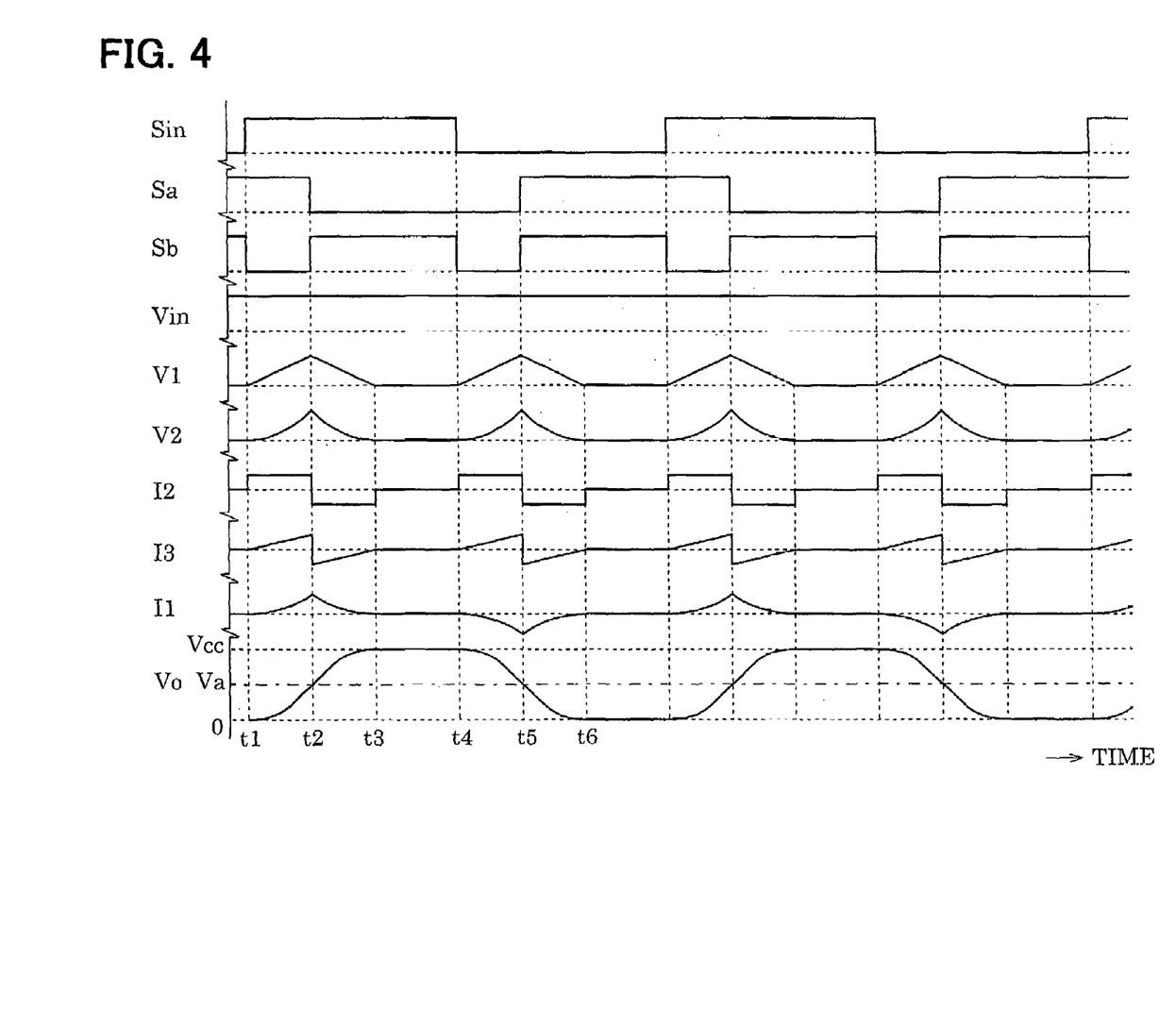
FIG. 4 is a waveform diagram showing signal waveforms appearing at various points in the second embodiment.

FIG. 4 shows the input signal Sin of a duty ratio of 50%, output signal Sa of the comparator 25, output signal Sb of the gate 26, input voltage Vin, output voltage V1 of the charging and discharging circuit 24 of the first stage, output voltage V2 of the charging and discharging circuit 34 (current control circuit 33), current I2 flowing into the capacitor 27, current I3 flowing into the capacitor 35, current I1 flowing into the capacitor 16 and output voltage Vo of the trapezoid signal generating circuit 11.

In this FIG. 4, the voltage V1, which the first-stage charging and discharging current circuit 24 in the current control circuit 33 outputs, is the same as the voltage V1 shown in FIG. 2. During the period from the time point t1 to the time point t2 in which the signal Sb is at the L level, a linearly increasing current I3 flows into the capacitor 35 from the current output circuit 36, and the voltage V2 rises in accordance with a quadratic function. Accordingly, a current I1 which increases in accordance with the quadratic function flows into the capacitor 16 from the current output circuit 18. Thus, the voltage Vo rises with a gradually increasing inclination in accordance with a cubic function.

During a time period from the time point t2 to time point t3 in which the signal Sb is at the H level, a linearly decreasing negative current I3 flows into the capacitor 35, and the terminal voltage V2 of the capacitor 35 falls in accordance with a quadratic function. As a result, the current I1 (>0) which decreases in accordance with the quadratic function flows into the capacitor 16 by the current output circuit 18 and 20. Thus, the voltage Vo rises with a gradually increasing inclination in accordance with the cubic function. When the voltage V2 falls to 0 at a time point t3, the voltage Vo stop rising. This operation is similar from a time point t4 to a time point t6, which corresponds to the falling portion of the voltage Vo.

Figure 5:
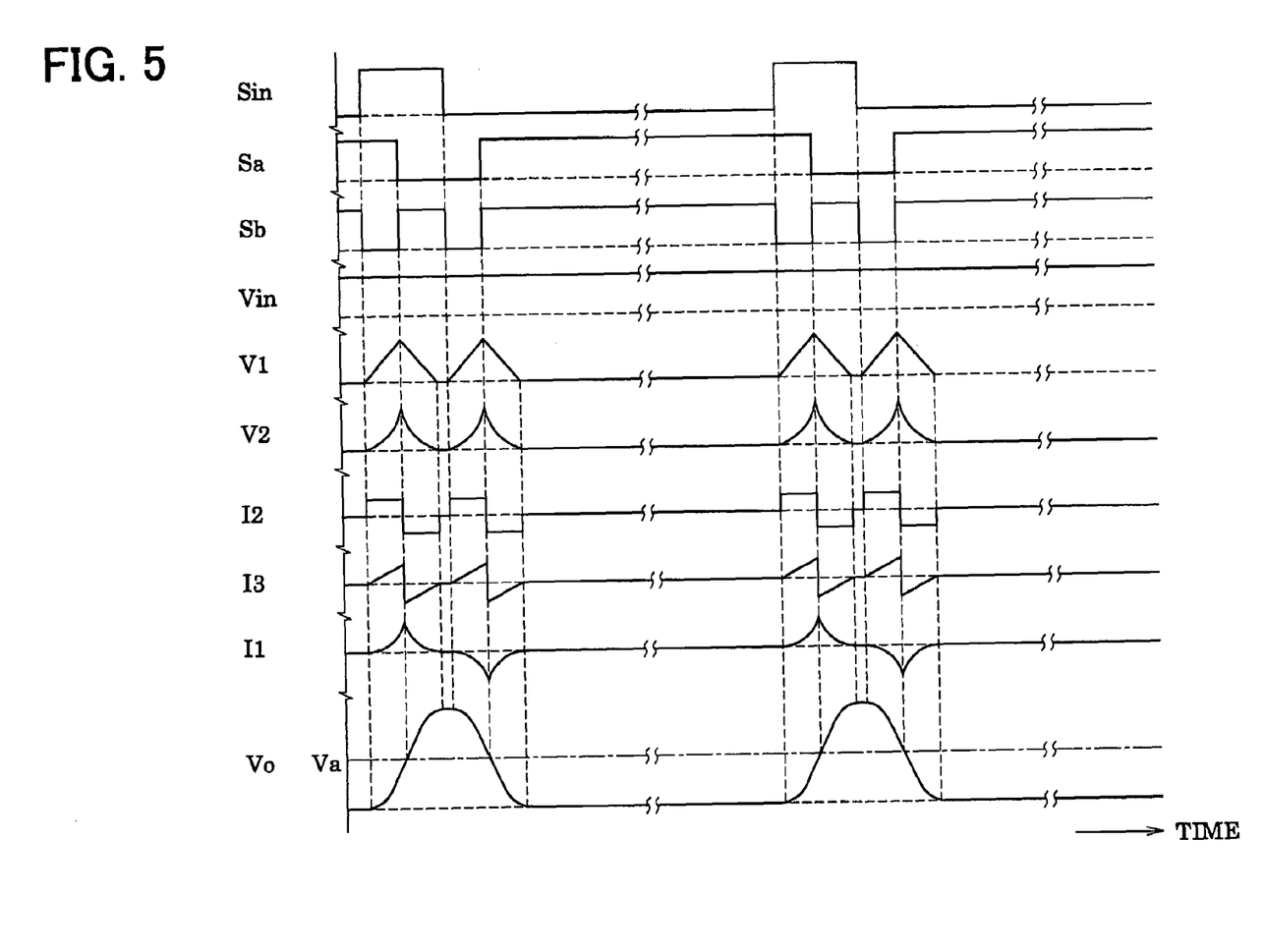
FIG. 5 is a waveform diagram showing signal waveforms appearing at various points in the second embodiment in the case that an input signal is different.

In case that the duty ratio of the input signal Sin is only about several %, the signals at each circuit position results in a trapezoid signal Vo having a shortened time period t3–t4 as shown in FIG. 5.

By constructing the current control circuit 33 with two charging and discharging circuits 24 and 33, the voltage V2 which is the command signal to the charging and discharging circuit 12 varies in accordance with the quadratic function, and the voltage Vo which is the trapezoid signal increases and decreases with the cubic function. As a result, the trapezoid signal is changed at a slower rate at its shoulders, and the harmonic components included in the trapezoid signal can be reduced more.

(Other Embodiments)

The present invention is not limited to the above embodiments, but may be modified as follows.

In the first embodiment, a certain offset voltage may be provided so that the voltage V1 which is the command signal does not fall to 0 volt. With this offset voltage, an offset current continues to flow to discharge the capacitor 16 while the input signal Sin is at the L level, and the terminal voltage Vo of the capacitor 16 can be decreased to 0 volt without fail. In addition, the offset current continues to flow to charge the capacitor 16 while the input signal Sin is at the H level, and the terminal voltage Vo of the capacitor 16 can be increased to the power supply voltage Vcc without fail. Therefore, even when the capacitor 16 is repetitively charged and discharged, the capacitor 16 is prevented from producing an offset voltage between its terminals. A certain offset voltage is preferably provided similarly in the second embodiment, so that the voltage V2 does not fall to 0 volt.

The current control circuits 13 and 33 may be constructed with three or more cascade-connected charging and discharging circuits, or constructed with different circuits other than charging and discharging circuits.

The ratio of output currents of the current output circuit 20 and the current output circuit 18 is not limited to 2. Generally, the current output circuit 20 is only required to produce a current of K times (K>1) of the current of the current output circuit 18. This relation is also applicable between the current output circuit 28 and the current output circuit 30 and between the current output circuit 36 and the current output circuit 38.

The reference voltage Va is not limited to one half of the power supply voltage Vcc.

What is claimed is:

1. A trapezoid signal generating circuit comprising:
    a capacitor for producing and outputting a trapezoid signal generating circuit trapezoid signal;
    a first current output circuit connected to the capacitor for supplying to the capacitor a charging current having a first magnitude;
    a second current output circuit connected to the capacitor for supplying from the capacitor a discharging current having a second magnitude which is K times (K>1) the charging current when a waveform control signal applied to the second current output circuit is at a first level, and stopping the discharging current when the waveform control signal is at a second level; and
    a current control circuit for receiving a trapezoid signal generating circuit input signal and being connected to the first current output circuit and the second current output circuit for supplying the first current output circuit with a command signal based on the input signal so that the charging current continuously increases from a first time point when the waveform control signal changes from the first level to the second level and continuously decreases after the trapezoid signal produced and output by the capacitor reaches a predetermined reference level, and for supplying the first and the second current output circuits with the command signal so that both of the charging current and the discharging current continuously increase from a second time point when the waveform control signal changes from the second level to the first level and continuously decrease after the trapezoid signal reaches the predetermined reference level.

2. The trapezoid signal generating circuit according to claim 1, wherein the current control circuit generates the command signal so that the charging current and the discharging current increase and decrease in accordance with a linear function with respect to an elapse of time from each time point of a level change between the first level and the second level in the waveform control signal.

3. The trapezoid signal generating circuit according to claim 1, wherein the current control circuit generates the command signal so that the charging current and the discharging current increase and decrease in accordance with a quadratic function with respect to an elapse of time from each time point of a level change between the first level and the second level in the waveform control signal.

4. The trapezoid signal generating circuit according to claim 1, wherein the predetermined reference level is set to one half of a power supply voltage, and the current control circuit generates the command signal so that each of the charging current and the discharging current increases and decreases at changing rates equal to each other.

5. The trapezoid signal generating circuit according to claim 1, wherein the current control circuit generates the command signal, which enables a continuous flow of a first predetermined offset current as the discharging current while the waveform control signal is at the first level, and enables a continuous flow of a second predetermined offset current as the charging current while the waveform control signal is at the second level.

6. The trapezoid signal generating circuit according to claim 1, wherein:
    the first and the second current output circuits respectively produce the charging current and the discharging current in accordance with the command signal;
    the current control circuit includes one or more cascade-connected charging and discharging circuits and produces the command signal from a last one of the one or more cascade-connected charging and discharging circuits; and
    the one or more cascade-connected charging and discharging circuits each include a command signal capacitor which produces the command signal, and a charging and discharging control circuit which charges the command signal capacitor with a first current corresponding to an input voltage from each time point of a level change between the first level and the second level of the waveform control signal and discharges the command signal capacitor with a second current corresponding to the input voltage after the trapezoid signal reaches the predetermined reference level.

7. The trapezoid signal generating circuit according to claim 6, wherein the current control circuit includes a single-stage charging and discharging circuit, and a fixed voltage is applied to the single-stage charging and discharging circuit.

8. The trapezoid signal generating circuit according to claim 6, wherein the current control circuit includes a two-stage charging and discharging circuit, and a fixed voltage is applied to a first stage of the two-stage charging and discharging circuit.

9. A trapezoid signal generating circuit comprising:
a reference signal input for receiving an input signal;
a current control circuit coupled to the input for receiving the input signal and for generating and outputting a command signal based on the input signal;
a first current output circuit coupled to the current control circuit for receiving the command signal from the current control circuit;
a second current output circuit coupled to the current control circuit for receiving the command signal from the current control circuit;
a capacitor coupled to both the first current output circuit and the second current output circuit for producing a trapezoid signal based on currents supplied by the first current output circuit and the second current output circuit; and
a circuit output for outputting the trapezoid signal produced by the capacitor, wherein
the first current output circuit is for supplying to the capacitor a charging current having a first magnitude, and
the second current output circuit is for supplying from the capacitor a discharging current having a second magnitude which is K times (K>1) the charging current when a waveform control signal applied to the second current output circuit is at a first level, and is for stopping the discharging current when the waveform control signal is at a second level.

10. The trapezoid signal generating circuit of claim 9, wherein the current control circuit is for supplying the first current output circuit with the command signal so that the charging current continuously increases from a first time point when the waveform control signal changes from the first level to the second level and continuously decreases after the trapezoid signal produced by the capacitor reaches a predetermined reference level, and for supplying the first and the second current output circuits with the command signal so that both of the charging current and the discharging current continuously increase from a second time point when the waveform control signal changes from the second level to the first level and continuously decrease after the trapezoid signal reaches the predetermined reference level.

* * * * *

UNITED STATES PATENT AND TRADEMARK OFFICE
CERTIFICATE OF CORRECTION

PATENT NO. : 7,154,310 B2 Page 1 of 1
APPLICATION NO. : 10/808542
DATED : March 25, 2004
INVENTOR(S) : Akio Kojima

It is certified that error appears in the above-identified patent and that said Letters Patent is hereby corrected as shown below:

Title Page

Filing date should read --(22) Filed: March 25, 2004--

Signed and Sealed this

Twentieth Day of March, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,154,310 B2 | Page 1 of 1 |
| APPLICATION NO. | : 10/808542 | |
| DATED | : December 26, 2006 | |
| INVENTOR(S) | : Akio Kojima | |

It is certified that error appears in the above-identified patent and that said Letters Patent is hereby corrected as shown below:

Title Page

Filing date should read --(22) Filed: March 25, 2004--

This certificate supersedes Certificate of Correction issued March 20, 2007.

Signed and Sealed this

Seventeenth Day of April, 2007

JON W. DUDAS
*Director of the United States Patent and Trademark Office*